US008319411B2

(12) United States Patent
Kling et al.

(10) Patent No.: US 8,319,411 B2
(45) Date of Patent: Nov. 27, 2012

(54) LAMP ASSEMBLY WITH SNAP-IN CAPSULE CLIP

(75) Inventors: Michael R. Kling, Lexington, KY (US); Jeffrey P. Buschmann, Lexington, KY (US); James E. Oetken, Winchester, KY (US)

(73) Assignee: OSRAM SYLVANIA Inc., Danvers, MA (US)

( * ) Notice: Subject to any disclaimer, the term of this patent is extended or adjusted under 35 U.S.C. 154(b) by 259 days.

(21) Appl. No.: 12/634,052

(22) Filed: Dec. 9, 2009

(65) Prior Publication Data

US 2010/0164351 A1 Jul. 1, 2010

Related U.S. Application Data

(60) Provisional application No. 61/141,285, filed on Dec. 30, 2008.

(51) Int. Cl.
*H01J 5/16* (2006.01)
*H05K 7/14* (2006.01)

(52) U.S. Cl. .............. 313/318.09; 313/292; 313/318.05; 313/318.07; 313/318.11; 313/113

(58) Field of Classification Search ........................ None
See application file for complete search history.

(56) References Cited

U.S. PATENT DOCUMENTS

| | | | |
|---|---|---|---|
| 4,598,225 A | 7/1986 | Gagnon | |
| 4,687,963 A | 8/1987 | Gagnon et al. | |
| 5,036,244 A | 7/1991 | Shaffer | |
| 5,043,624 A * | 8/1991 | Hirozumi et al. | 313/318.09 |

(Continued)

FOREIGN PATENT DOCUMENTS

FR 2587786 A1 3/1987

(Continued)

OTHER PUBLICATIONS

European Search Report and Annex for corresponding European Patent Application EP 09180973, mailed May 6, 2010.

*Primary Examiner* — Ashok Patel

(74) *Attorney, Agent, or Firm* — Edward S. Podszus

(57) ABSTRACT

A lamp (10) has a light source (12) with a distal portion (14) and a proximal portion (16), the proximal portion (16) comprising a press seal (17) having a given cross-section. A lamp envelope (18) receives the light source (12), the envelope (18) being arrayed about a longitudinal axis (20) and having a base (22) generally orthogonal to the longitudinal axis (20). A clip-receiving aperture (24) is formed in the base (22), and at least one clip locator surface (26, 52, 54) is formed in the base (22) adjacent the clip-receiving aperture (24). A clip (28) is positioned in the clip-receiving aperture (24), the clip having a passage (29) shaped and formed to receive the press seal (17) of the light source (12) therein. The clip (28) has at least one first retainer (32) and at least one second retainer (33), the at least one first retainer (32) being shaped and formed to engage the at least one clip locator surface (26, 52, 54), whereby the clip (28) is located within the clip-receiving aperture (24). The at least one second retainer (33) is shaped and formed to secure the clip (28) to the base (22), and at least one third retainer (34) is shaped and formed to secure the press seal (17) of the light source (12) within the clip (28).

23 Claims, 8 Drawing Sheets

U.S. PATENT DOCUMENTS

| | | | | |
|---|---|---|---|---|
| 5,057,735 | A | 10/1991 | Zalar et al. | |
| 5,751,095 | A | 5/1998 | Zalar | |
| 5,855,430 | A * | 1/1999 | Coushaine et al. | 362/519 |
| 6,741,034 | B2 | 5/2004 | Scholz | |
| 7,008,096 | B1 | 3/2006 | Coushaine et al. | |
| 7,207,695 | B2 | 4/2007 | Coushaine et al. | |
| 7,261,451 | B2 | 8/2007 | Coushaine et al. | |
| 2001/0000686 | A1 * | 5/2001 | Coushaine | 362/418 |
| 2005/0212396 | A1 | 9/2005 | Oetken et al. | |
| 2005/0213332 | A1 | 9/2005 | Kendrick et al. | |
| 2007/0069652 | A1 | 3/2007 | Smith et al. | |
| 2008/0054775 | A1 | 3/2008 | Kling et al. | |
| 2008/0057819 | A1 | 3/2008 | Kling et al. | |
| 2008/0272695 | A1 | 11/2008 | Misiaszek et al. | |
| 2009/0103294 | A1 | 4/2009 | Zhang | |

FOREIGN PATENT DOCUMENTS

| | | | |
|---|---|---|---|
| FR | 2590966 | A1 | 6/1987 |
| GB | 1271375 | A | 4/1972 |

* cited by examiner

LAMP ASSEMBLY WITH SNAP-IN CAPSULE CLIP

CROSS-REFERENCE TO RELATED APPLICATIONS

This application claims priority from Provisional Patent Application Ser. No. 61/141,285, filed Dec. 30, 2008, in the names of Michael R. Kling, Jeffrey P. Buschmann and James E. Oetken.

GOVERNMENT CONTRACT

This invention was not made under any government contract and the United States Government has no rights under this invention.

TECHNICAL FIELD

This invention relates to lamps and more particularly to lamps that include a light source capsule positioned within an outer envelope. Still more particularly, it relates to a clip for accurately mounting a light source capsule within an outer envelope and to methods of making the lamp.

BACKGROUND ART

An increasing number of lamps employ a light source capsule mounted within an outer envelope. While the light source capsule can be an arc discharge tube, a tungsten halogen capsule or other light source, particular reference herein will be made to lamps employing a tungsten halogen light sources. Such light sources are known and operate on the regenerative action of the halogen cycle.

One form of lamp that can utilize such a light source is a parabolic reflector (PAR) ("parabolic aluminized reflector") lamp. Such lamps typically comprise, for example, a tungsten halogen capsule comprised of quartz or a hard glass, mounted in a pressed borosilicate glass body having a reflective coating applied to the inner surface of the body. A pressed glass lens usually covers the front aperture of the body and may contain optical elements to give a desired beam shape, for example, a spot or flood configuration. General service PAR lamps typically have a medium screw base attached to the body for electrical connection to 100V to 240V circuits. In many tungsten halogen PAR lamps the hard glass capsule contains stiff electrical lead-ins that connect to the relatively deformable inner leads of the light source and that are themselves pressed into the seal area of the capsule. Such capsules are shown in U.S. Pat. No. 5,660,462 (Bockley, et al.), and U.S. Published Patent Applications 2005/0212396 (Oetken, et al.) and 2006/0043890 (Kling) (all of which are assigned to the assignee of the instant invention). Often, in such lamps the capsule is supported by crimping the leads into metal eyelets that are formed in the base of the envelope body.

Most PAR lamps on the market are assembled by inserting the capsule from the front aperture and attaching the capsule lead-ins to the heel of the reflector body by eyelets, ferrules, ceramic body or cement. In some cases additional support is provided by a metal disc surrounding the capsule press. Many PAR38 halogen lamps (a particularly popular size) typically have a hard glass or quartz capsule supported solely be crimping both capsule lead-ins into metal eyelets compressed into two holes in the reflector heel. This requires a very tight tolerance on reflector hole dimensions that increases the cost of the reflector. In another common PAR lamp construction, the capsule is inserted into a metal disk that rests on a shelf in the reflector neck. Axial movement is prevented by crimping metal eyelets onto capsule lead-ins near the outer reflector heel surface. This construction does not require tight reflector hole tolerances, but the added metal disk and additional assembly operations increase the manufacturing costs. Such a technique is shown in U.S. Pat. No. 5,751,095 (Zalar), which also employs multiple glass or ceramic insulators to guide the lead-ins to the screw base.

Further, in prior art PAR lamps some of the light entering the neck opening is lost due to multiple reflection and absorbtion by the mount and capsule components and does not contribute to the beam. It is well known that neck opening cross-sectional area should be as small as possible to maximize bean intensity and lamp efficiency (as defined by lamp lumens divided by source lumens). Both inner and outer surfaces of the reflector must have a suitable draft angle for removal from a mold. Pressed glass used for PAR lamps typically require a minimum draft angle of 3 degrees and in practice, a 5 degree draft angle is typically employed. When the capsule is supported solely by lead-ins crimped into eyelets, the neck ID must be large enough to allow room for the eyelet flares.

Additionally, various forms of brackets have been employed to support and mount light sources contained within capsules, such as are shown in U.S. Pat. No. 6,741,034 (Scholz) (an arc tube within a shroud); U.S. Pat. No. 7,008,096 (Coushaine, et al.) (a tungsten halogen capsule); U.S. Pat. No. 7,261,451 (Coushaine, et al.) (tungsten halogen or arc discharge tube); U.S. Pat. No. 7,207,695 (Coushaine, et al.) (light emitting diodes); and U.S. Published Patent Applications 2007/0069652 (Smith et al) (arc discharge tube or tungsten halogen capsule); 2008/0054775 (Kling, et al.) (tungsten halogen capsule); 2008/0057819 (Kling) et al (tungsten halogen capsule); 2008/0272695 (Misiaszek) (tungsten halogen capsule) and 2009/0103294 (Zhang et al.) (light emitting diodes). With the exception of the latter publication, the remaining patents, pending patent applications and publications listed directly above in this paragraph are assigned to the assignee of the instant invention.

While all of the above-recited solutions have provided workable lamps, they all present problems that, if eliminated or reduced, would clearly supply more economical and/or more efficient lamps.

DISCLOSURE OF INVENTION

It is an object of the invention to enhance lamps containing light source capsules.

Yet another object of the invention is the improvement of lamp containing light source capsules.

Still another object of the invention is the improvement of methods of making lamps.

These objects are accomplished, in one aspect of the invention, by the provision of a lamp that has a light source with a distal portion and a proximal portion, the proximal portion comprising a press seal having a given cross-section. The lamp has a lamp envelope for receiving the light source, and the envelope is arrayed about a longitudinal axis. The envelope has a base orthogonal to the longitudinal axis.

A clip-receiving aperture is formed in the base of the envelope and the clip-receiving aperture has at least one clip locator recess formed in the base adjacent the clip-receiving aperture. A clip is positioned in the clip-receiving aperture, the clip having a passage shaped and formed to receive the press seal therein. The clip has at least one first retainer and at least one second retainer, the first and second retainers being shaped and formed to secure the clip within the clip-receiving aperture and at least one third retainer to secure the press seal of the light source within the clip. The first retainer is positioned at least partly within the clip locator recess and resists translation or rotation of the clip relative the clip-receiving aperture. The first retainer can also be resiliently formed to bear against the side wall of the clip locator recess, which increases retention of the clip in the clip-receiving aperture. The second retainer can be formed as a resilient depending wall that is biased outwardly and squeezed together to securely sit inside the clip-receiving aperture. The second retainer can be formed as a detent providing mechanical interference to a surface of the envelope base so as to block removal of the clip from the clip-receiving aperture. The clip can include as a retention feature either the resilient leg, or the detent, or in preferred embodiments include both the resilient leg and the detent features. In a further preferred embodiment the clip has at least one tongue or side tab engaged with the at least one clip locator recess.

Methods of making a lamp according to aspects of the invention include the steps of forming an envelope having an envelope base with a clip-receiving aperture extending from a rear side of the envelope to a front side of the envelope, forming a clip to be received in the clip-receiving aperture and providing a light source passage on a surface of the clip, inserting a light source through the light source passage, latching the inserted light source to the clip, inserting the clip through the clip receiving aperture, and latching the clip to the envelope to retain the light source in position with respect to the envelope.

The clip can be retained to the envelope first and then the light source can be retained to the clip. Alternatively, the clip can be retained to the light source first and then the clip and light source can be retained to the envelope.

The plural retaining features on the clip greatly ease the assembly operation and provide accurate positioning of the light source with respect to an associated envelope, thus insuring proper location of the desired focal point.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
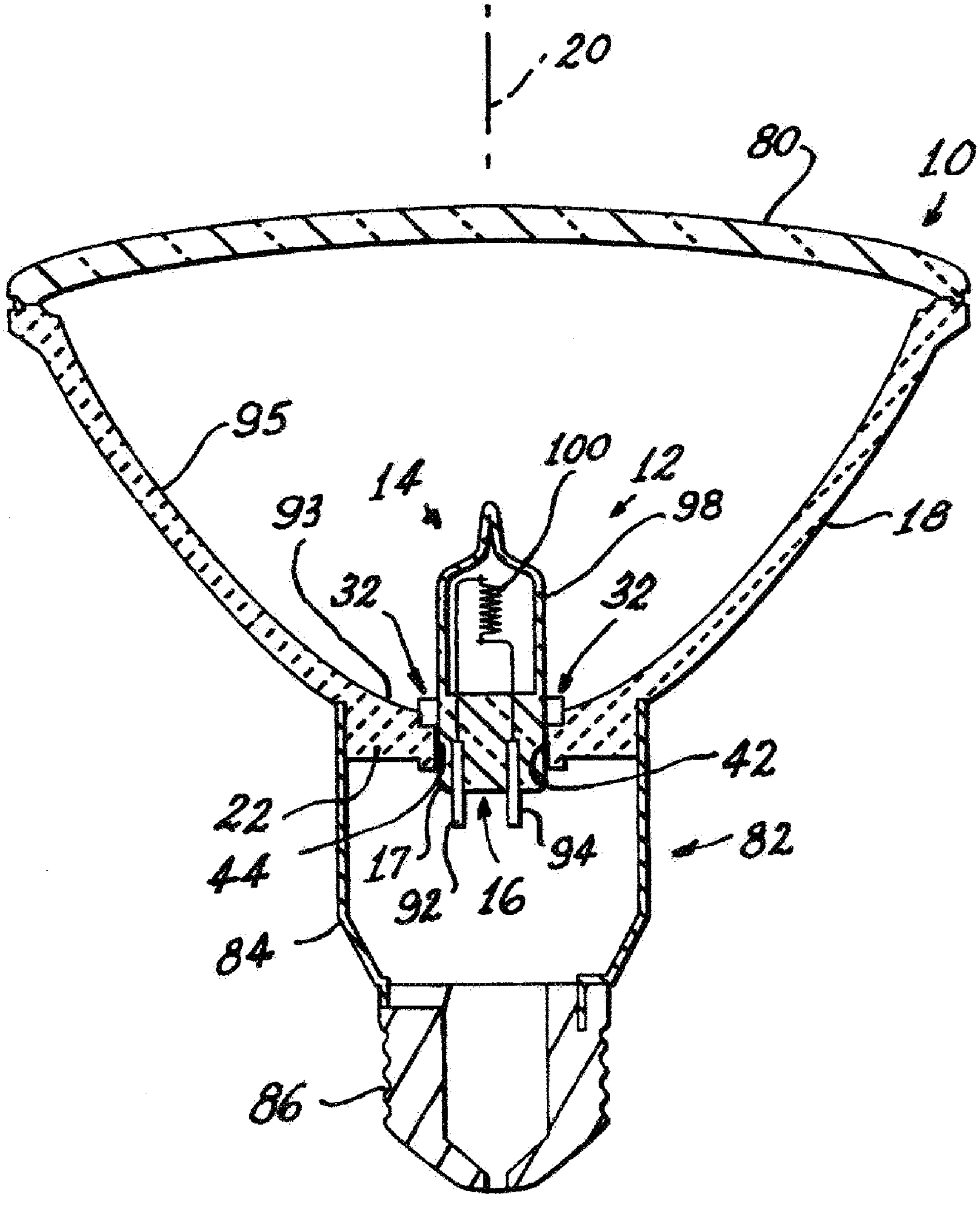
FIG. 1 is a cross sectional view of an embodiment of the invention.
Figure 2:
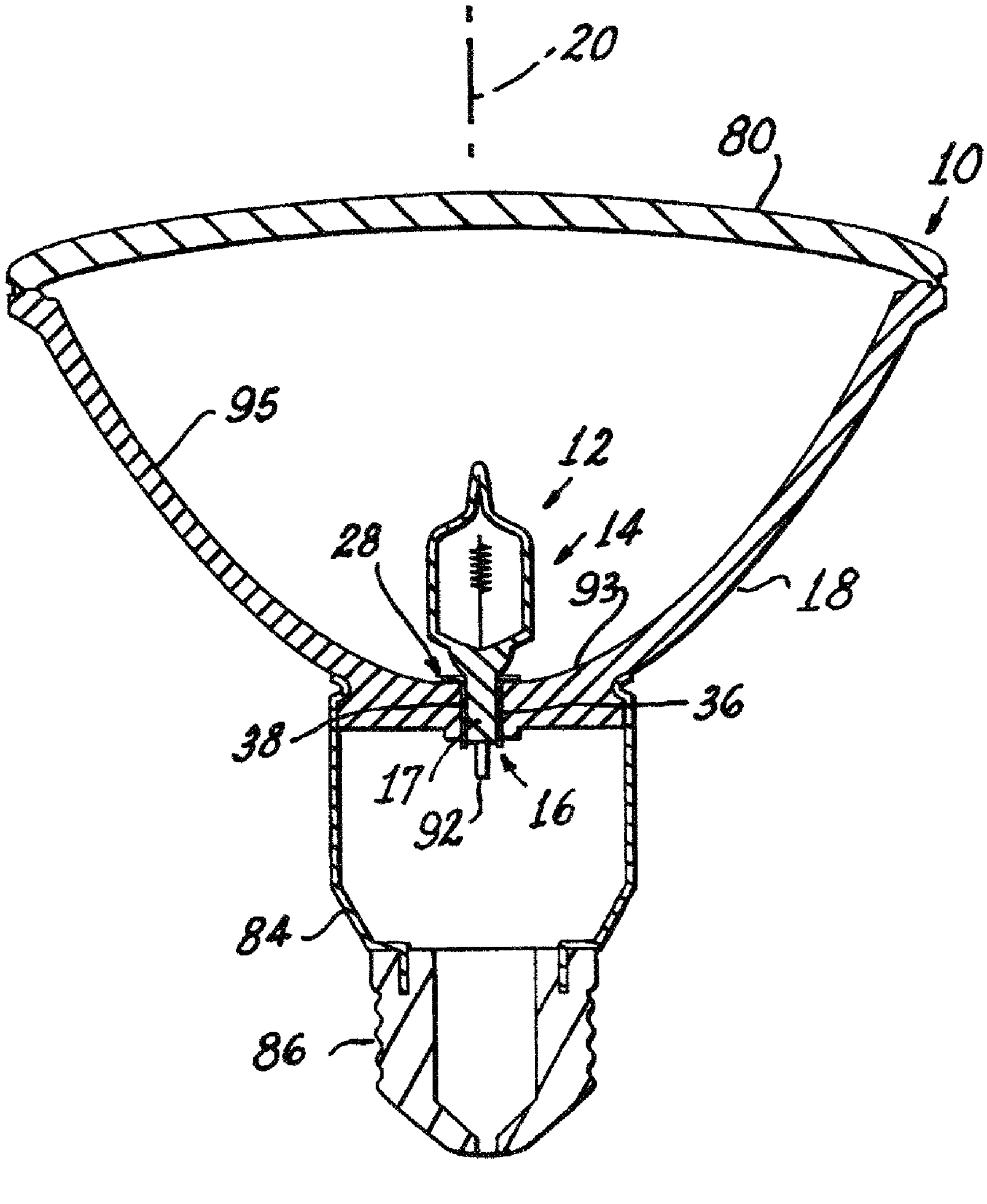
FIG. 2 is a cross sectional view of the embodiment of FIG. 1 rotated 90 degrees.

Referring now to the drawings with greater particularity there is shown in FIGS. 1 and 2 a lamp 10 comprising a light source 12 having a distal portion 14 and a proximal portion 16. The light source 12 can be an arc discharge tube or a tungsten halogen capsule and, in the preferred embodiment, is a tungsten halogen light capsule. The proximal portion 16 has a press seal 17 having a given cross-section, which, in the preferred embodiment is rectangular.

A lamp envelope 18 receives the light source 12, and the envelope 18 is arrayed about a longitudinal axis 20 and has a base 22 arrayed orthogonal to the longitudinal axis 20.

Figure 6:
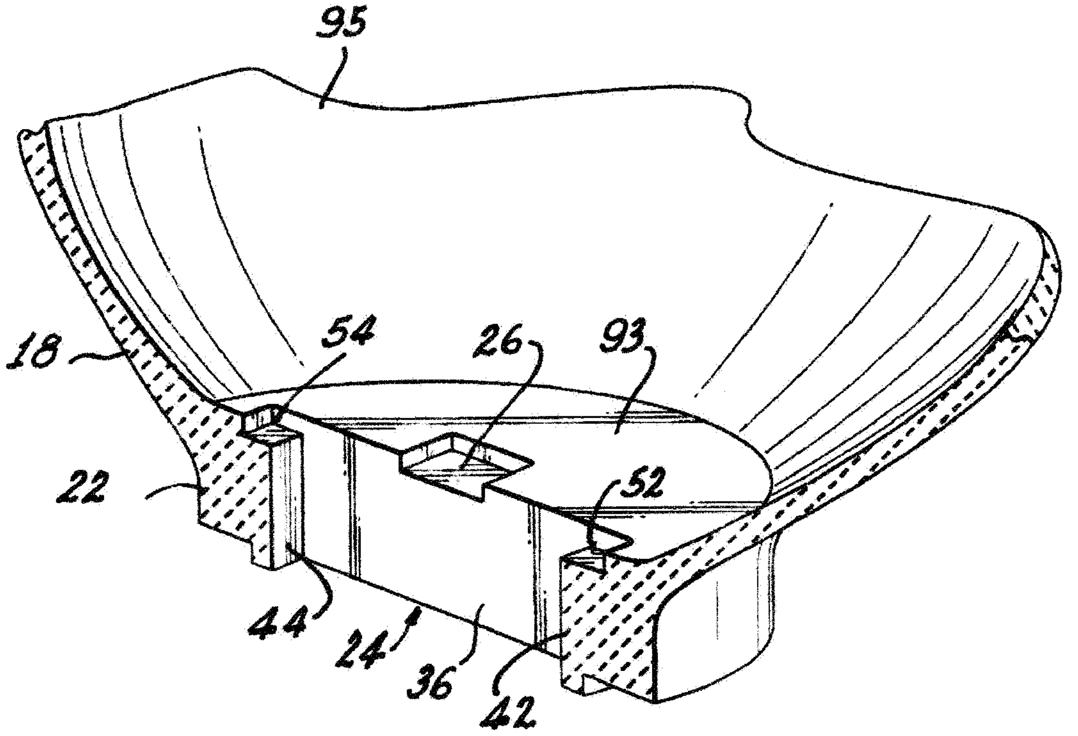
FIG. 6 is an enlarged, partial perspective view of an envelope base and associated passage.

A clip-receiving aperture 24 is formed in the base 22, the clip-receiving aperture 24 having at least one and preferably two clip locator surfaces 26 formed on the edges thereof. The clip-receiving aperture 24 is shown in a partial sectional view in FIG. 6 and in the preferred embodiment the clip-receiving aperture 24 is substantially rectangular with two opposed sides 36, 38 and two opposed ends 42, 44.

Figure 3:
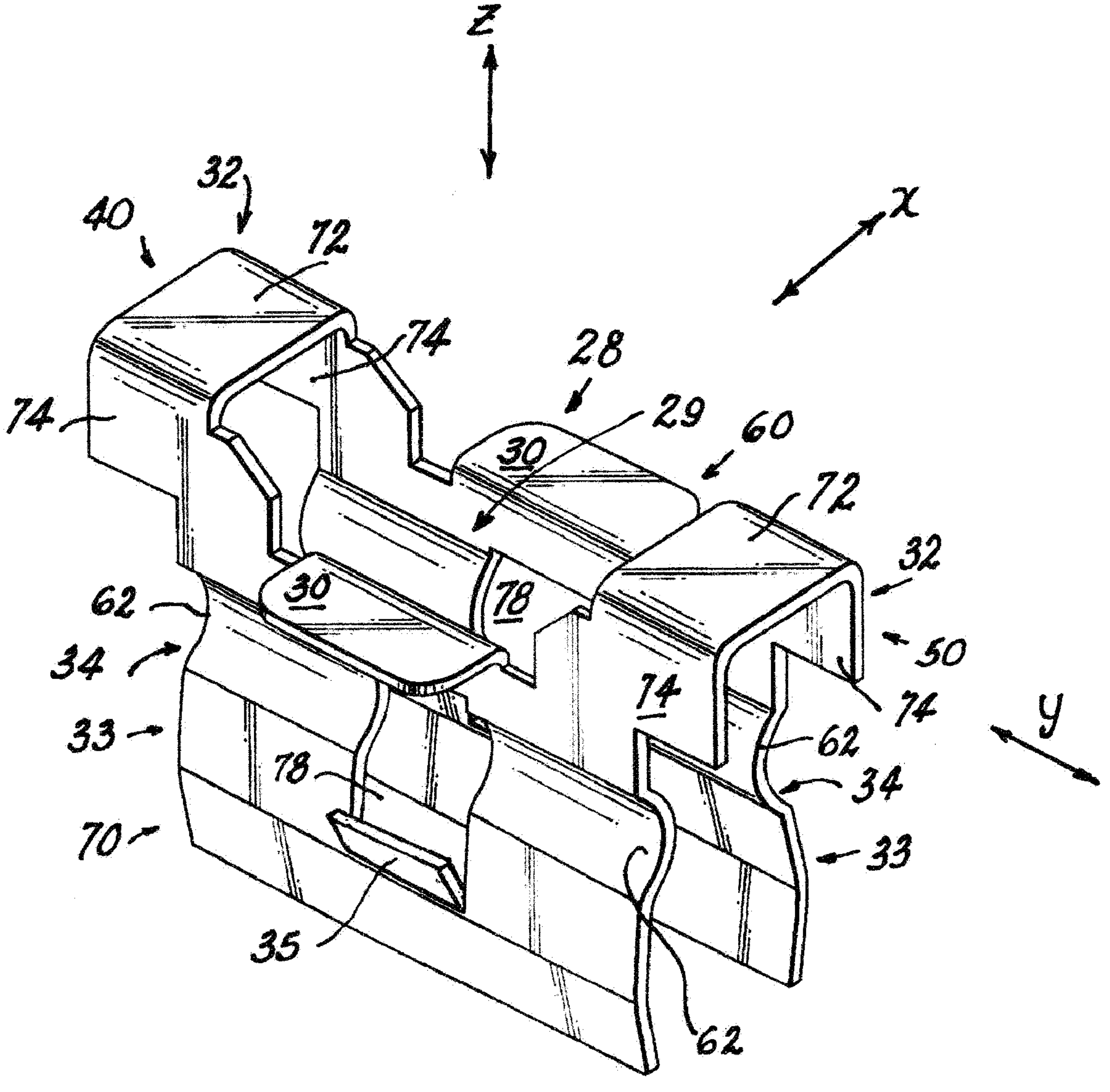
FIG. 3 is a perspective view of an embodiment of a clip for use with the invention.

A clip 28, shown in detail in FIG. 3, is positioned in the clip-receiving aperture 24 and is formed from a resilient material such as spring steel. Clip 28 is preferably formed as a unitary piece such as a stamping. The clip 28 has a passage 29 shaped and formed to receive the press seal 17 therein, the passage being defined by clip sides 60 and 70 and ends 30 and 40. That is, in the particular embodiment shown, the passage 29 has a substantially rectangular configuration. The clip 28 as shown has two tongues or side tabs 30 that extend from the sides 60 and 70 and engage with two clip locator recesses or surfaces 26 that are disposed on opposite sides of the passage 29. The clip 28 has at least one first retainer 32 and at least one second retainer 33, the first retainer 32 being shaped and formed to locate the clip 28 relative the clip-receiving aperture 24, the second retainer 33 being shaped and formed to secure, such as by latching, the clip 28 with the clip-receiving aperture 24, and at least one third retainer 34 shaped and formed to secure the press seal 17 of the light source 12 within the clip 28 and, as shown in a preferred embodiment, there are plural first, second and third retainers 32, 33, 34 that are arranged in opposing pairs, with the first retainers 32 being associated with the ends 40 and 50 respectively and the second retainers 33 being formed as portions of the sides 60 and 70.

The width of the sides 60, 70 at the location of the second retainers 32 is wider that the width of the slot in the glass base 22, in particular the width between opposed sides 36, 38 of the chip-receiving aperture 24. The clip is thus retained even when the lamp capsule 12 is not yet inserted into clip, which simplifies assembly and eliminates the need for molded-in eyelets. The second retainers 33 are below tongues 30 and the first retainers 32. The surfaces 26 and depressions 52, 54 that receive the lower surfaces of, respectively, tongues 30 and the first retainers 32 can be, but do not have to be, co-planar. Clip 28 has a generally elongate body in the shape of a U-channel with squared-off corners, with the side wall 60, 70 depending from an upper surface such as a top surface 72 which approximately forms a bight or web between depending resilient side walls. The use of such a clip eliminates the use of eyelets.

An advantage of the eyelet elimination or the elimination of a capsule supporting disk it that this allows for the elimination of the neck region entirely, providing increased light output and beam intensity. What is referred to as the neck region that is not required is an internal volume or void typically present on lamps such as conventional PAR lamps where wall surfaces depending from the parabolic reflector portion define a well, depression or pocket, which is in communication with the internal, useful volume defined by the reflectorized parabolic reflector surface, in which a portion of the light source sits, typically including the electrodes, press seal region and portion of the light-generating filament, as illustrated in patent reference US2008/0057819 (Kling) at FIGS. 1-2, see neck region (15) or neck region (55) therein. Furthermore, the inventive assembly method positions the light source more accurately and repeatably with less variability in performance. The process steps of molding eyelets into the reflector shell, inserting lead-ins into the eyelets and subsequently swaging the eyelets to the lead-ins are replaced by simple axial insertion motion.

Figure 5:
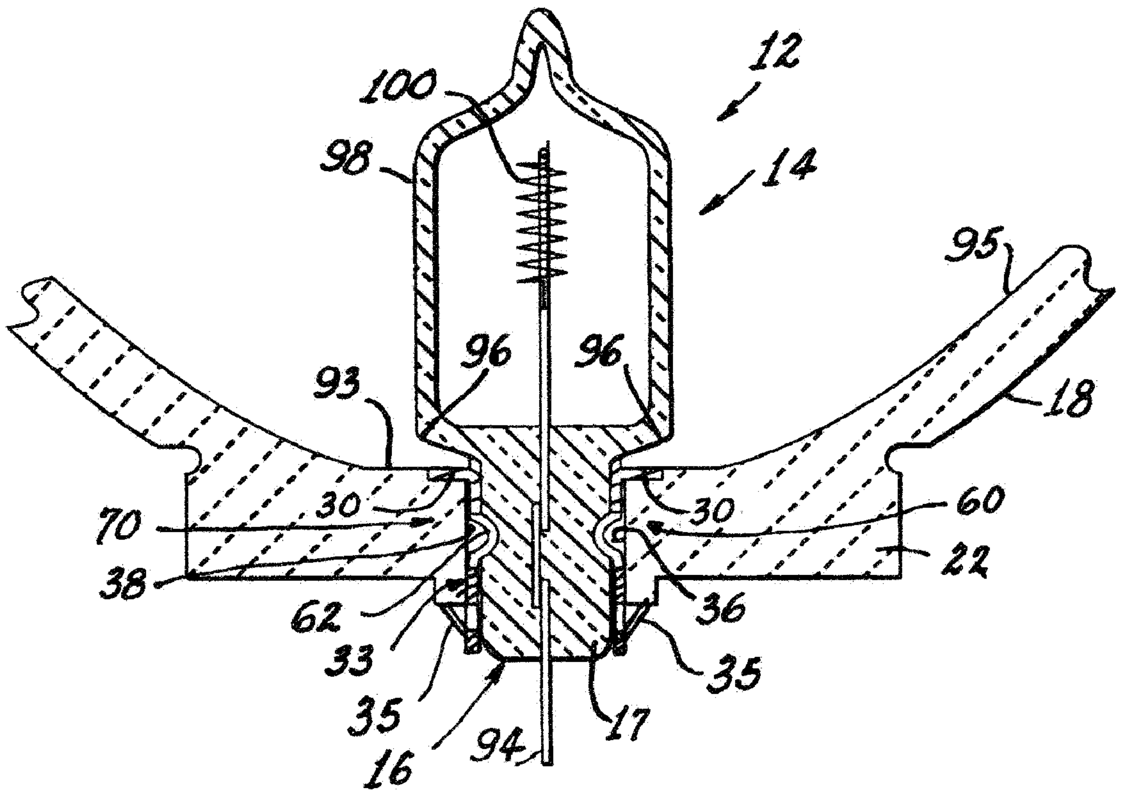
FIG. 5 is an enlarged, partial sectional view of an envelope base with a clip and capsule inserted.

In addition to the retainers recited above, in an alternate embodiment of the invention, a detent 35, shown in FIGS. 3 and 5 can be provided. The detent 35 is positioned near the bottom edge of clip 28 and can be struck therefrom and bent slightly outwardly from the sides 60 and 70. These outwardly flared detents 35 provide retention by mechanical interference with a rear surface of the base 22 adjacent slot surfaces 36, 38. The detent 35 can be used to embody the second retainer 33 or in addition to second retainer 33.

The opposed ends 42, 44 of the clip-receiving aperture 24 are provided with depressions 52, 54 respectively and the first retainers 32, which have a clip top surface 72 with depending legs 74, are received in the depressions 52, 54. First retainer 32 is preferably formed of resiliently compressible side legs 74 such that when the width of first retainer 32 is slightly wider than the width of the depressions 52, 54, the first retainer 32 is compressed slightly, which augments the retention force of clip 28 provided by second retainers 33 and detents 35.

Figure 8:
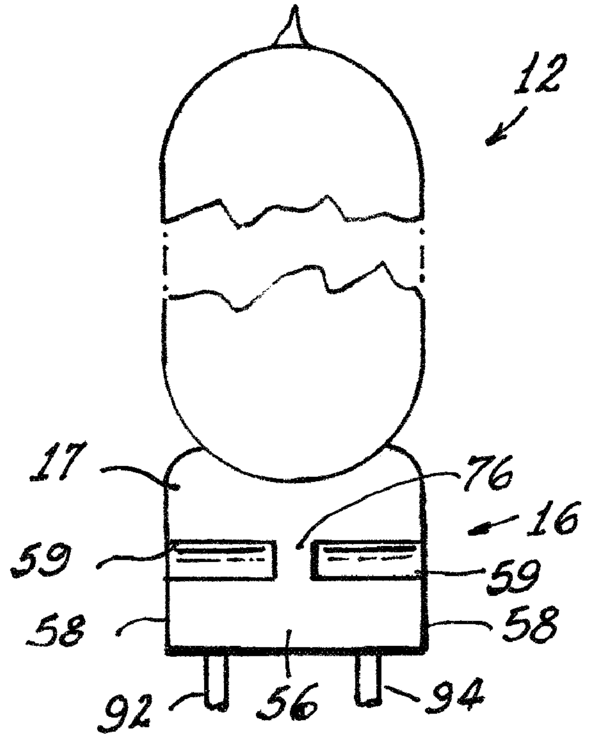
FIG. 8 is an elevation view of an embodiment of a capsule illustrating a press seal.
Figure 9:
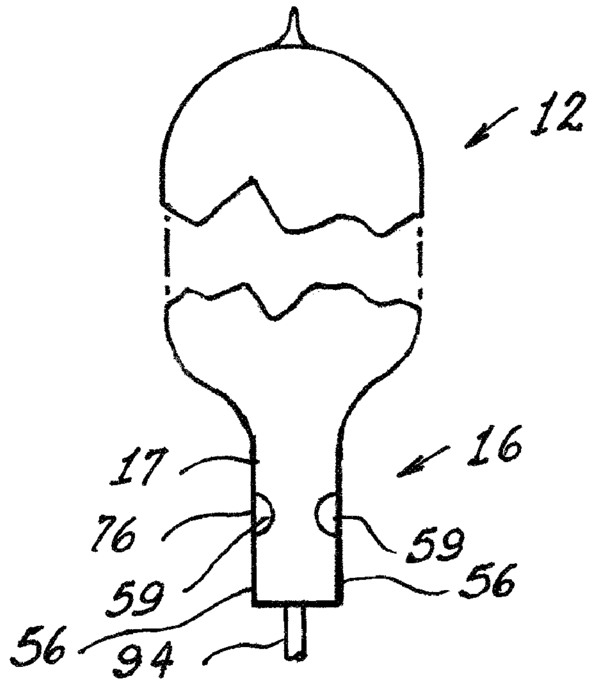
FIG. 9 is a view similar to FIG. 8, rotated 90 degrees.

The press seal 17 (shown in FIGS. 8 and 9) has two long sides 56 and two narrow ends 58 and each of the two long sides 56 contain indentations 59 and the third retainers 34 are formed as protuberances 62 that cooperate with the indentations 59 when the press seal 17 is positioned in the passage 29, as shown in FIG. 5. In a preferred embodiment a web 76 is positioned between the indentations 59. The web 76 is in register with and, preferably engages openings 78 formed in the sides 60 and 70 of the clip 28 and provides lateral stability to the light source 12 when the press seal 17 is engaged with the light source receiving aperture 29. As shown in the illustrations the indentations 59 and protuberances 62 are circular sections; however, any other suitable configuration can be employed. The clip 28 preferably has a high thermal conductivity, and the coupling between the clip 28 and the press seal 17 is adjacent a region that has the highest thermal stress along the length of the lamp leads 92, 94, thus functioning to remove thermal stress away from the critical areas of the press seal 17.

Figure 4:
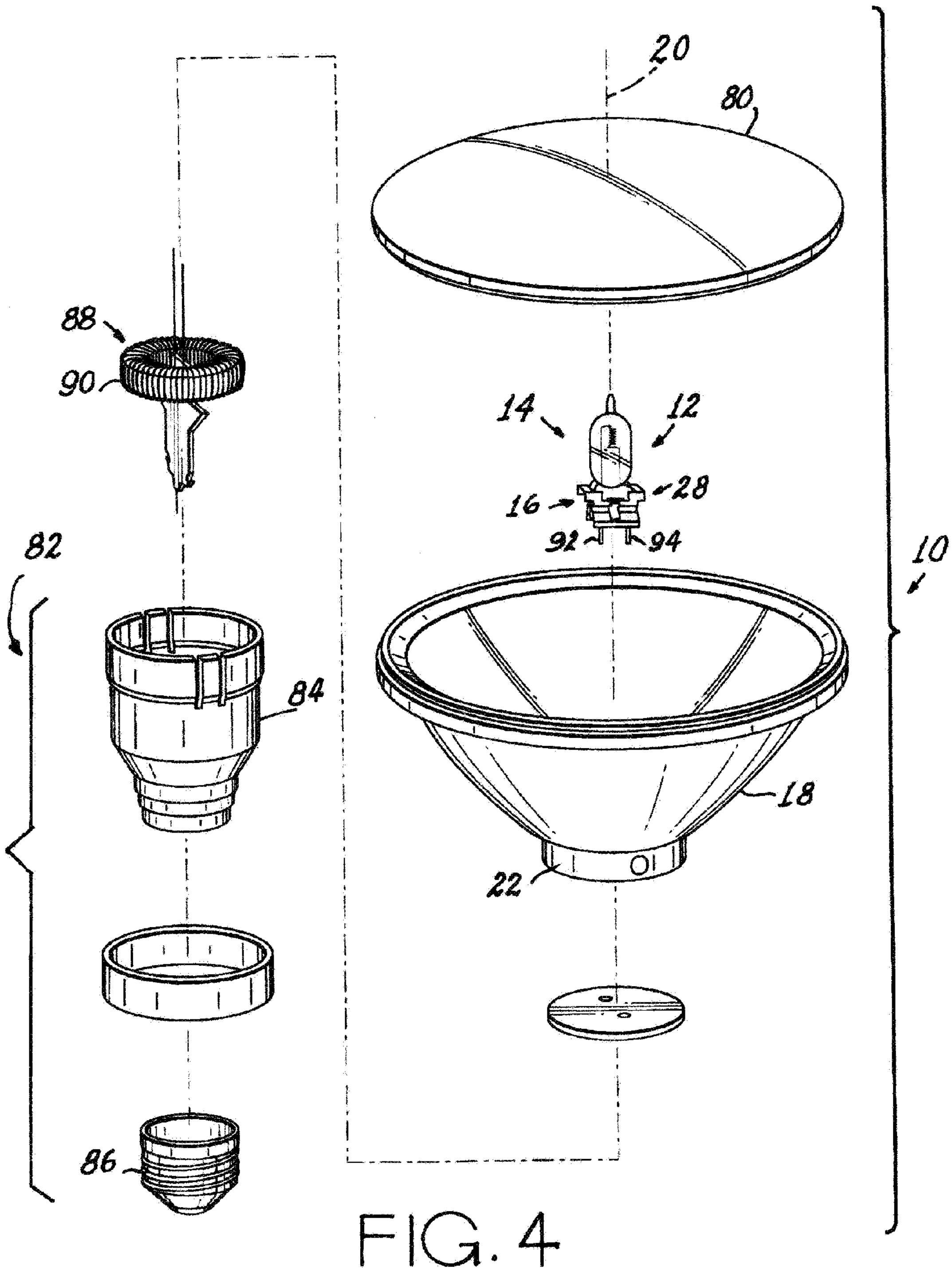
FIG. 4 is an exploded, perspective of a lamp according to an aspect of the invention.

The lamp 10 (shown in exploded view in FIG. 4) has envelope 18, a lens 80 and a bottom portion 82, the latter being composed of a hollow section 84 and a screw base 86. In a preferred embodiment of the invention the lamp 10 can be an energy-saving lamp that includes additional electrical components 88 such, for example, as transformer 90.

Alternatively, the lamp 10 could have a heavy envelope such as shown in U.S. Pat. No. 4,598,225 (Gagnon) or U.S. Pat. No. 5,036,244 (Shaffer), wherein a base 22 with a clip 28 and capsule 12 mounted therein could be sealed to an envelope such as envelope (12) of the '225 patent or envelope (16) of the '244 patent, replacing the wire supporting structures of those lamps.

The lamp 10 is constructed by forming the envelope 18 with the envelope base 22 and a clip-receiving aperture 24 extending from a rear side of the base 22 to a front side of the base 22. A clip 28 is formed to be received in the clip-receiving aperture 24, the clip 24 containing a light source passage 29. A light source 12 has its press seal 17 inserted through the light source passage 29 and is latched to the clip 28 via the third retainers 34 having protuberances 62 formed on the sides 60 and 70 of the clip 28 engaging the indentations 59 formed on the press seal 17. The clip 28 is then inserted into the clip-receiving aperture 24 and latched therein by engagement of the resiliency of the second retainers 33 urging against the walls 36, 38 of the clip-receiving aperture 24. The clip 28 is located within the base 22 by the tongues 30 being received into the clip locator surfaces 26 and the first retainers engaging the depressions 52, 54. It should be sufficient to locate the clip 28 spatially by the use of either one tongue 30 or one first retainer 32, and still more preferred from the standpoint of symmetry and ease of manufacture to use a pair of tongues 30 and a pair of retainers 32. The lamp 10 can then be completed in conventional fashion by applying the lens 80 and the bottom portion 82.

Alternatively, the clip 28 can be inserted into the clip-receiving aperture 24 and retained within the base 22 before the light source 12 is inserted into the clip 28. The resiliency of the walls 60, 70 urges the second retainers 33 sufficiently against the surfaces of side walls 36, 38 that even without the presence of the lamp capsule 12 and its press seal 17 (which tends to slightly spread open the walls 60 and 70 by interaction with third retainer 34 protuberances 62), the clip 28 and base 22 assembly can be inverted without the clip 28 falling out under the force of gravity or shaking, which further facilitates manufacturing assembly convenience.

Thus there is provided lamp 10 having a simple and economical mount for a light source capsule 12. The clip 28 fixes the light source 12 in both the horizontal X and Y axes by the first and second retainers 32, 33 and in the vertical Z axis by the third retainers 34 comprised of the protuberances 62 and the indentations 59. The multiple retainers aid greatly in establishing and maintaining the proper focal settings for the light source 12. Further, since the capsule 12 is totally supported by the clip 28 and the clip-receiving aperture 24, there is no need to employ the heavy metal lead-ins sealed into the glass, as was often used by the prior art, thus avoiding the differences in thermal expansion between the heavy metal lead-ins and the glass that eventually caused cracking problems that shortened the life of the lamps. Additionally, the presence of the wide light source passage 29 virtually eliminates the problems of bent or distorted lead-ins that can occur when attempting to fit the lead-ins into eyelets since the eyelets have been removed. The use of the clip simplifies lamp assembly and allows a more efficient reflector shape. Measurements made comparing prior art lamps with the lamp of the invention show 5 percent higher lumens and 20 percent higher beam intensity.

The present invention is particularly suited to a PAR lamp. In another advantageous embodiment, the lamp according to the invention provides a lamp that is devoid of a neck, thus having increased light output, which is enabled by use of clip 28. Light source 12 has a glass capsule 98 in which light-generating element 100, such as a filament, is disposed. It is understood that light-generating element 100 could be a source of light other than a filament, such as an arc. The capsule 98 is sealed by press seal 17. At the transition from capsule 98 proximal the press seal 17 there is a shoulder 96 generally at the juncture between press seal 17 and the remainder of capsule 98 that is not pressed to form press seal 17. First electrode 92 and second electrode 94 are in electrical communication with light-generating element 100. The electrodes 92, 94 extend through press seal 17 and exit from press seal 17, that is the electrodes stick out from press seal 17. Lamp envelope 18 has a reflector portion 95, which is curved, preferably smoothly or continuously curved, and more preferably a parabolic reflector, in particular a parabolic aluminized reflector such that lamp 10 is a PAR lamp. The reflector portion 95 intersects base 22. Preferably reflector portion 95 blends directly into the upwardly facing floor surface 93 of base 22; such a direct transition is preferably uninterrupted by other surface features but does have a draft angle, fillet or radius blending parabolic reflector portion 95 to base 22, the base 22 being approximately orthogonal to longitudinal axis 20 of envelope 18.

Figure 7:
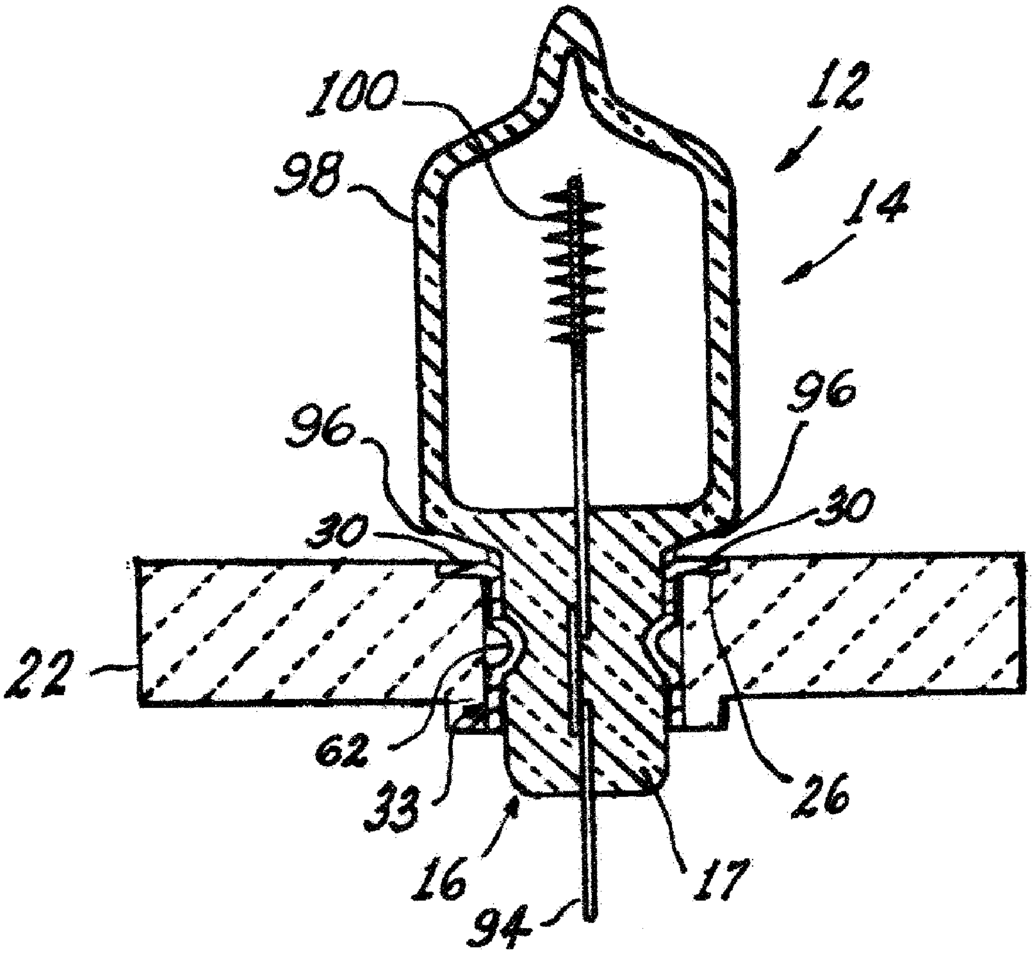
FIG. 7 is a partial, sectional view of an alternate envelope useable with the invention.

In one aspect of the assembled condition of lamp 10, with the press seal 17 retained such as by clip 28 in aperture 24, the light-generating element 100 is positioned above floor surface 93. This contributes the advantage that light from capsule 98 can strike directly the reflector portion 95 and emanate usefully from lamp 10 rather than be directed into a neck region below reflector portion 95. The shoulder 96 is closely adjacent floor surface 93, as shown in FIG. 7. With press seal 17 retained in aperture 24, the electrodes 92, 94 exit from press seal 17 at a region that is below upwardly facing floor surface 93, which can help reduce glare from unwanted reflection of light from capsule 98 off the electrodes. As shown in FIG. 2 or FIG. 7, a substantial portion, preferably a portion somewhat more than half, thus a major portion, of press seal 17 is disposed below floor surface 93.

In another aspect of an assembled lamp 10, with press seal 17 received in aperture 24, a location at which electrodes 92, 94 exit press seal 17 is below floor surface 93. Retainer clip 28 is preferably used to secure press seal 17 in aperture 24. In this arrangement also light-generating element 100 is positioned above floor surface 93.

While there have been shown and described what are at present considered to be the preferred embodiments of the invention, it will be apparent to those skilled in the art that various changes and modifications can be made herein without departing from the scope of the invention as defined by the appended claims.

Without being a limitation, reference numerals used herein are conveniently listed below:

10 Lamp
12 Light source
14 Proximal portion of 12
16 Distal portion of 12
17. Press seal
18 Lamp envelope
20 Longitudinal axis
22 Envelope base
24 Clip-receiving passage
26 Clip locator
28 Clip
29 Light source receiving aperture
30 Tongue on clip 28
32 First retainers on clip 28
33 Second retainers on clip 28
34 Third retainers on clip 28
35 Detents on walls 60, 70
36 Side wall of 24
38 Side wall of 24
40 First side of clip 28
42 End wall of 24
44 End wall of 24
50 Second side of clip 28
52 Depression on end 36
54 Depression on end 38
56 Long sides of 17
58 Narrow ends of 17
59 Indentation of 56
60 Third side of clip
62 Protuberance on 34
70 Fourth side of clip
72 Clip top surface of 32
74 Legs depending from 72
76 Web between indentations 59
78 Openings in sides 60 and 70 to cooperate with web 76
80 Lamp lens
82 Bottom portion of lamp 10
84 Hollow section of 82
86 Screw base
88 Electrical component
90 Transformer
92 First electrode
93 Floor of base
94 Second electrode
95 Reflector portion
96 Press seal shoulder
98 Lamp capsule
100 Light-generating element

What is claimed is:

1. A lamp (10), comprising:

a light source (12) having a distal portion (14) and a proximal portion (16), said proximal portion (16) comprising a press seal (17);

a lamp envelope (18) formed to receive said light source (12), said envelope (18) being arrayed about a longitudinal axis (20) and having a base (22) generally orthogonal to said longitudinal axis (20);

a clip-receiving aperture (24) formed in said base (22), and at least one clip locator surface (26, 52, 54) formed in said base (22) adjacent said clip-receiving aperture (24); and a clip (28) positioned in said clip-receiving aperture (24), said clip having a passage (29) shaped and formed to receive said press seal (17) therein, said clip (28) having at least one first retainer (32) and at least one second retainer (33) formed as a resilient portion, said at least one first retainer (32) being shaped and formed to engage said at least one clip locator surface (26, 52, 54) whereby said clip (28) is located within said clip-receiving aperture (24), said at least one second retainer (33) being shaped and formed to urge against said clip receiving aperture (24) to secure said clip (28) to said base (22), and at least one third retainer (34) shaped and formed to secure said press seal (17) of said light source (12) within said clip (28).

2. The lamp (10) of claim 1 wherein said clip (28) is formed of resilient material.

3. The lamp (10) of claim 1 wherein said second retainer (33) is formed as a detent shaped and formed to provide interference engagement with a surface of said base (22) to hinder removal of said clip (28) from said base (22)

4. The lamp (10) of claim 1 wherein said second retainer (33) is formed as a resilient wall portion (60, 70).

5. The lamp (10) of claim I wherein said first retainer (32) is formed as a laterally outwardly extending side tab (30).

6. The lamp (10) of claim 1 wherein said first retainer (32) is formed as a leg (74) depending from a clip top surface (72).

7. The lamp (10) of claim 1 further comprising at least one tongue (30) engaged with at least one clip locator surface (26).

8. The lamp (10) of claim 1 wherein said at least one first retainer (32) comprises a plurality of first retainers (32), said at least one second retainer (33) comprises a plurality of second retainers (33) and said at least one third retainer (34) comprises a plurality of third retainers (34).

9. The lamp (10) of claim 8 wherein the plurality of first retainers (32) comprises at least a pair of opposing first retainers (32), the plurality of second retainers (33) comprises at least a pair of opposing second retainers (33) and the plurality of third retainers (34) comprises at least a pair of opposing third retainers (34).

10. The lamp (10) of claim 1 wherein said press seal (17) has two long sides (56) and two narrow ends (58) and each of said two long sides (56) contains an indentation (59) and said third retainer (34) comprises a protuberance (62) that cooperates with said indentation (59) when said press seal (17) is positioned in said passage (29).

11. The lamp (10) of claim 1 wherein said first retainer (32) is formed as a resilient wall that urges against said at least one clip locator surface (52, 54) to secure said clip (28).

12. The lamp (10) of claim 1, wherein said lamp envelope (18) defines a reflector portion (95) arrayed around said longitudinal axis (20).

13. A lamp (10) comprising:

a light source (12) having a distal portion (14) and a proximal portion (16), said proximal portion (16) comprising a press seal (17);

a lamp envelope (18) formed to receive said light source (12), said envelope (18) being arrayed about a longitudinal axis (20) and having a base (22) generally orthogonal to said longitudinal axis (20);

a clip-receiving aperture (24) formed in said base (22), and at least one clip locator surface (26, 52, 54) formed in said base (22) adjacent said clip-receiving aperture (24); and a clip (28) positioned in said clip-receiving aperture (24), said clip having a passage (29) shaped and formed to receive said press seal (17) therein, said clip (28) having at least one first retainer (32) and at least one second retainer (33) said at least one first retainer (32) being shaped and formed to engage said at least one clip locator surface (26, 52, 54) whereby said clip (28) is located within said clip-receiving aperture (24), said at least one second retainer (33) being shaped and formed to secure said clip (28) to said base (22), and at least one third retainer (34) shaped and formed to secure said press seal (17) of said light source (12) within said clip (28), wherein said clip receiving aperture (24) is substantially rectangular with two opposed sides (36, 38) and two opposed ends (42, 44) and wherein there are two clip locators (26) oppositely disposed adjacent said sides (36, 38).

14. The lamp (10) of claim 13 wherein said opposed ends (42, 44) are provided with a respective depression (52, 54) and said first retainers (32) are received in said depressions (52, 54).

15. The lamp (10) of claim 14 wherein said opposed sides (36, 38) receive said second retainers (33).

16. A lamp (10), comprising:

a light source (12) having a distal portion (14) and a proximal portion (16), said proximal portion (16) comprising a press seal (17), said light source (12) comprising a light-generating element (100) disposed between said proximal portion (16) and said distal portion (14);

a lamp envelope (18) formed to receive said light source (12), said envelope (18) being arrayed about a longitudinal axis (20), said envelope defining a reflector portion (95) and having a base (22) generally orthogonal to said longitudinal axis (20), said reflector portion (95) intersecting said base (22);

said base (22) defining an upwardly facing floor surface (93) and an aperture (24) defined in said floor (93) to receive said press seal (17), wherein said base further defines at least two pair of opposing clip locators (26, 52, 54) recessed into said floor surface (93) adjacent said aperture (24);

a retention clip (28) positioned within said aperture (24) secured to said base (22) and in engagement with said press seal (17), said clip (28) comprising a plurality of first retainers (32) and a plurality of outwardly extending tabs (30) shaped to be received in said pairs of opposing clip locators (26, 52, 54); and said press seal (17) being disposed in said aperture (24) secured by said clip (28), whereby said light-generating element (100) is positioned above said floor surface (93).

17. The lamp (10) of claim 16, wherein said light source (12) comprises a capsule (98) in which said light-generating element (100) is disposed, said press seal (17) forming a shoulder (96) adjoining a proximal portion of said capsule (98), said shoulder (96) being closely adjacent said floor surface (93).

18. The lamp (10) of claim 16, wherein said light source (12) comprises first and second electrodes (92, 94) in electrical communication with said light-generating element (100), said electrodes (92, 94) extending through said press seal (17), wherein a location at which said electrodes (92, 94) exit said press seal (17) is disposed below said upwardly facing floor surface (93).

19. The lamp (10) of claim 16, wherein said envelope (18) is devoid of a neck region defining an internal void facing said light-generating element (100) of said light source (12).

20. The lamp (10) of claim 16, wherein said light source (12) comprises a capsule (98) in which said light-generating element (100) is disposed; and said reflector portion (95) comprises a region of direct transition to said floor surface (93), said region of transition being devoid of a depending wall portion extending parallel to said longitudinal axis (20) defining an internal void facing said capsule (98) of said light source (12).

21. The lamp (10) of claim 16, wherein a major portion of said press seal (17) extending in a direction along said longitudinal axis (20) is disposed below said floor surface (93).

22. The lamp (10) of claim 16, wherein said reflector portion (95) defines a parabolic reflector surface.

23. The lamp (10) of claim 16, wherein said reflector portion (95) defines a parabolic reflector surface whereby said lamp (10) is a PAR lamp.

* * * * *